United States Patent
Arnold

(10) Patent No.: US 9,905,483 B2
(45) Date of Patent: Feb. 27, 2018

(54) ADAPTIVE VALUE CAPTURE FOR PROCESS MONITORING

(71) Applicant: Advantest (Singapore) Pte. Ltd., Singapore (SG)

(72) Inventor: Henry Arnold, Yorba Linda, CA (US)

(73) Assignee: ADVANTEST CORPORATION, Tokyo (JP)

( * ) Notice: Subject to any disclaimer, the term of this patent is extended or adjusted under 35 U.S.C. 154(b) by 741 days.

(21) Appl. No.: 14/151,587

(22) Filed: Jan. 9, 2014

(65) Prior Publication Data

US 2015/0193378 A1 Jul. 9, 2015

(51) Int. Cl.
*H01L 21/66* (2006.01)
*G05B 19/418* (2006.01)

(52) U.S. Cl.
CPC ........ *H01L 22/20* (2013.01); *G05B 19/41875* (2013.01); *G05B 2219/32191* (2013.01); *G05B 2219/32206* (2013.01); *G05B 2219/32224* (2013.01); *G05B 2219/37224* (2013.01); *Y02P 90/22* (2015.11)

(58) Field of Classification Search
CPC ......................... G05B 19/41875; H01L 22/20
See application file for complete search history.

(56) References Cited

U.S. PATENT DOCUMENTS

2006/0085155 A1* 4/2006 Miguelanez ....... G01R 31/2836
702/118

* cited by examiner

*Primary Examiner* — Manuel Rivera Vargas

(57) ABSTRACT

A method for analyzing test results. The method includes selecting a first subset of tests from a plurality of tests. Test results are gathered from the plurality of tests in real-time. A first statistical analysis is performed on test results from the first subset of tests. At least one process control rule is initiated as determined by results of the first statistical analysis performed on the test results from the first subset of tests.

15 Claims, 14 Drawing Sheets

AVC Loaded for rest of lot processing

Rest of Lot

Result Comparison across the lot

Wafer Bin Data
+
Measured Value Fail Data
Data Arranged in Tabular Form 710

MVM Raw Data Statistical Analysis: XY Plots, Scatter Plots, Histograms, and Wafer Maps Scenario: New Test Program – Rest of Lot Trend Rule Marginal Rule Scenario: SPC Value Selection

ADAPTIVE VALUE CAPTURE FOR PROCESS MONITORING

TECHNICAL FIELD

The present disclosure relates generally to the field of automated test equipment and more specifically to the field of real time statistical process control of automated test equipment.

BACKGROUND

Automated test equipment (ATE) can be any testing assembly that performs a test on a device, semiconductor wafer, or die, etc. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing.

The test results that are provided from an ATE assembly may then be analyzed to evaluate the electronic component tested. Such test result evaluations may be part of a statistical process control method. In one exemplary embodiment, statistical process control methods may be used to monitor and control a manufacturing process to ensure that the manufacturing process is producing the desired product at a desired level of efficiency and at a desired level of quality. For example, after a prescribed ATE test run has completed, the compiled test results are statistically analyzed using a statistical process control method. Changes to the manufacturing process and/or test process may also be implemented in follow-on production runs based upon the statistical analysis of the test results.

SUMMARY OF THE INVENTION

Embodiments of this present invention provide solutions to the challenges inherent in statistically monitoring critical value data from all the test data gathered during a testing process (e.g., wafer testing). Various embodiments of the present invention provide monitoring of test measurement data to identify critical data while capturing a small, critical subset of the total data (the total data is also saved to a data log) for future reference. In one embodiment, critical tests and their test results are selected for real-time evaluation based on tests that are known to have failed, be marginal, or trending towards failure.

In a method according to one embodiment of the present invention, a method for analyzing test results is disclosed. The method comprises selecting a first subset of tests from a plurality of tests. Test results are gathered from the plurality of tests. A first statistical analysis is performed on test results from the subset of tests. At least one process control rule is initiated as determined by results of the first statistical analysis performed on the test results from the first subset of tests.

In a computer-readable medium according to one embodiment of the present invention, computer-readable program code embodied therein for causing a computer system to perform a method for analyzing test results is disclosed. The method comprises selecting a first subset of tests from a plurality of tests. Test results are gathered from the plurality of tests. A first statistical analysis is performed on test results from the subset of tests. At least one process control rule is initiated as determined by results of the first statistical analysis performed on the test results from the first subset of tests.

In an apparatus according to one embodiment of the present invention, the apparatus comprises a measured value monitor, an adaptive value capture module, and a statistical process control module. The measured value monitor is operable to receive test results from a plurality of tests. The adaptive value capture module is operable to select a first subset of tests from the plurality of tests. The measured value monitor is further operable to gather test results from the first subset of tests and perform a first statistical analysis on the gathered test results from the first subset of tests. The statistical process control module is operable to initiate at least one process control rule as determined by results of the first statistical analysis performed on the gathered test results from the first subset of tests.

BRIEF DESCRIPTION OF THE DRAWINGS

Embodiments of the present invention will be better understood from the following detailed description, taken in conjunction with the accompanying drawing figures in which like reference characters designate like elements and in which.

DETAILED DESCRIPTION

Figure 1:
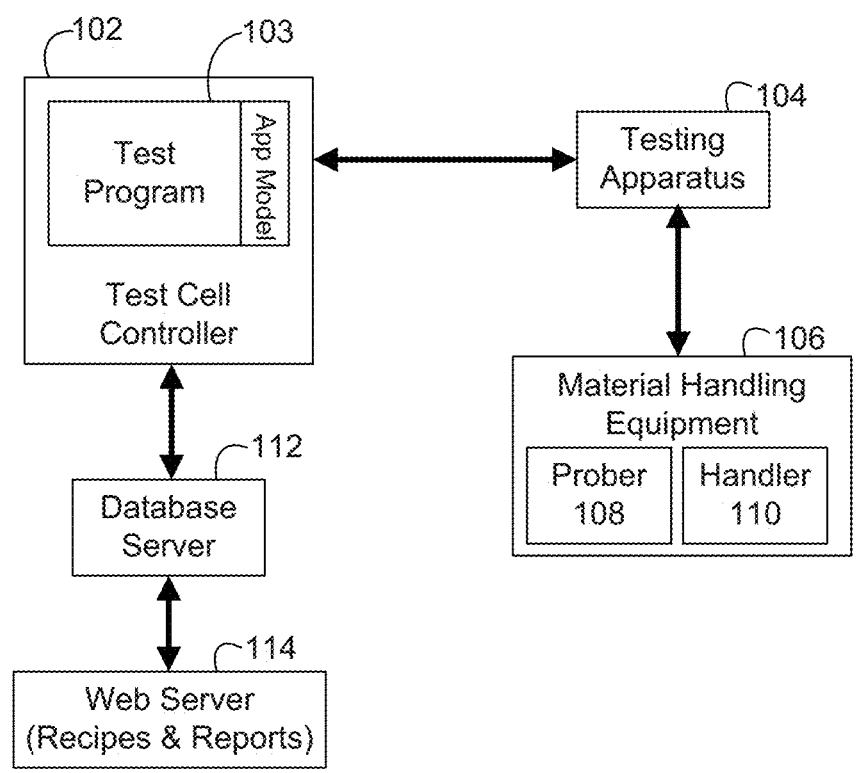
FIG. 1 illustrates an exemplary simplified block diagram of an automated test equipment (ATE) implementing statistical process controls in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

NOTATION AND NOMENCLATURE

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Embodiments of this present invention provide solutions to the challenges inherent in statistically identifying critical test measurement data from all the test data gathered during a testing process (e.g., wafer testing). Various embodiments of the present invention provide real-time processing of critical test measurement data. As discussed in detail below, an exemplary adaptive value capture process works continuously from process run to process run, bringing forward previous problem areas. Such an exemplary adaptation to current and past process problems helps to increase the efficiency of the process being monitored by identifying and analyzing in real-time only critical test data values. The exemplary process selects test data values for real-time evaluation based on tests that are known to fail, known to be recovery failures, test results that are marginal, or test results that are trending towards failure. Such a selection of tests to monitor provides a predictive element to process problems through historical forwarding of failure modes.

Exemplary Test Cell Testing, Data Collection, and Failure Procedures:

An exemplary test cell may be configured for testing semiconductor wafers. In one embodiment, the test cell receives a plastic container (also referred to as a cassette) filled with semiconductor wafers. The semiconductor wafers may also be from a same lot. The semiconductor wafers of a lot all come from a same silicon ingot and go through a same manufacturing process, so will all have similar characteristics such as yield and failures.

In one embodiment, when a test cell is testing parts (e.g., electronic devices, semiconductor devices, and semiconductor wafers with their semiconductor dies), the failing parts are dropped into numbered bins. However, knowing that a quantity of parts have dropped into a particular numbered bin doesn't always identify what test(s) have failed. Tests may be written so that failures from more than one test will result in a failing part falling into a same bin. For example, a dozen different tests could all have their failing parts fall into a common failure bin. This may result in difficulties in determining which tests are failing and why. Conventionally, a semiconductor wafer must complete testing before the test results saved to a data log are available for analysis. As noted herein, such testing may take three to four hours or more to complete. Furthermore, it might take the testing and analysis of several semiconductor wafers (taking up a whole day of testing time) before a determination is made that a serious testing failure or product defect is present.

Statistical Process Control Analysis:

As discussed herein, statistical process control (SPC) rules may be executed in a short loop on an exemplary test cell controller. SPC rules provide early detection, notification, and control actions through statistical analysis of various test data parameters such as parametric test values, yield values, and bin results. The SPC rules may be executed in synchronicity with normal test cell controller program activities, such as handler and prober equipment communications. In one exemplary embodiment, SPC rules may be used to detect whether lot testing process results are in or out of control. For example, a Gaussian process parameter distribution which is running out of control may be characterized by a mean or standard deviation statistic which has drifted from an expected value. In a further example, iddq measurements (iddq testing is a method for testing integrated circuits for manufacturing faults) that are running higher than the normal standard deviation may indicate a die that will experience early failure because of internal breakdown. A go/no-go test might miss this, while statistical process rule analysis may identify it. These statistical values may be monitored live during a lot test, and identified SPC failures (e.g. control rule violations) may be used to trigger corrective or abortive actions. By detecting an SPC rule failure and taking some action as discussed herein before the testing has completed, unnecessary testing time may be avoided, identified problems may be corrected, and yields and other evaluative metrics may be improved.

Exemplary embodiments utilizing SPC rule analysis may provide for the detection of historical results such as a bin that has had too many failures, a site that has yields lower than other sites, and statistical value results which are drifting from their in-control ideal values. SPC methods may also detect process issues on parts that are passing but are not within predicted process limits. For example, while parts may be passing within hard limits, violations of SPC rules, once detected in real-time, can be used to determine that process issues are present and may be addressed.

An exemplary statistical analysis and process control framework executed on a test cell controller may provide many benefits. For example, non-invasively capturing measurement values and bin counts for the calculation of statistical results.

SPC rules, result analysis, and reporting may be centrally managed. SPC rules may also be integrated within existing test programs without requiring any changes to an application model. Prober and handler equipment may be controlled from SPC rule actions without the need for a custom driver when an existing driver has the required control capabilities. Lastly, custom SPC rules may be created for a specific testing environment and a specific device-under-test. Table 1 lists several exemplary SPC rules. Exemplary SPC rules may be custom designed for a particular type of data to be monitored, the type of rule itself, as well as the types of actions that may be implemented with the detection of the associated SPC rule violation. SPC rule data types, monitoring types, and actions are not limited to what is shown. Exemplary SPC rules may also include enhancements to monitor other types of data and use additional types of analysis and actions. U.S. patent application Ser. No. 13/444,705, by Arnold et al., titled "CREATION AND SCHEDULING OF A DECISION AND EXECUTION TREE OF A TEST CELL CONTROLLER," which is herein incorporated by reference, provides a review of statistical process control (SPC) rules which may provide early detection, notification and handling of defects during test cell operations.

TABLE 1 example rule types, data monitored and actions taken

| Data Monitored | Rule Type | Actions |
| --- | --- | --- |
| Yield | Limit monitoring | Email |
| Bin count | Site-to-site difference | Needle clean |
| Measured value | Trend monitoring | Retest |
| Prober/handler parameters | Marginal Monitoring | Z-height adjustment |
| Custom data source | | Stop test |

Test Cell with Integrated Statistical Analysis and Process Control:

As illustrated in FIG. 1, an exemplary automated test equipment 100 embodiment with integrated statistical process control comprises: a test cell controller 102, a testing apparatus 104, material handling equipment 106, a database server 112, and a web server 114 (e.g. containing control rule recipes and reports). The automated test equipment 100 may provide real-time statistical analysis of test results and an insertion of prober or handler commands that are transparent to a test program 103.

In one exemplary embodiment, the material handling equipment 106 may comprise a prober 108 and a handler 110. In one exemplary embodiment, the prober 108 is a socket or probe card comprising a plurality of pins or needles that come in contact with a device-under-test (e.g., semiconductor wafer, die, etc.). As illustrated in FIG. 1, a test cell controller 102 may comprise a test program 103. The test program 103 may comprise an application model. The web server 110 may be used to enter SPC rules, analyze results, and monitor process. The web server 110 may also comprise a web-based SPC editor for creating and editing SPC rules. In exemplary embodiments, the web server 110 may be a desktop computer with a web browser. The testing apparatus 104, in addition to testing, may capture test result values, bin counts, and various types of yield counts used to test SPC rules. In one exemplary embodiment, a plurality of testing apparatuses 104 may be controlled by the test cell controller 102 and evaluated for statistical process control.

Results of data collection (raw and statistical) and SPC rules execution may be stored on the database server 112. The web server 114 may access these stored results, as well as other tools, as described in detail below. Data in this database 112 may be analyzed during SPC rule evaluations. In one exemplary embodiment, the test controller 114 further comprises a statistical analysis and process control framework that non-intrusively captures test results and tests the SPC rules with minimum overhead and a small code footprint.

Figure 2:
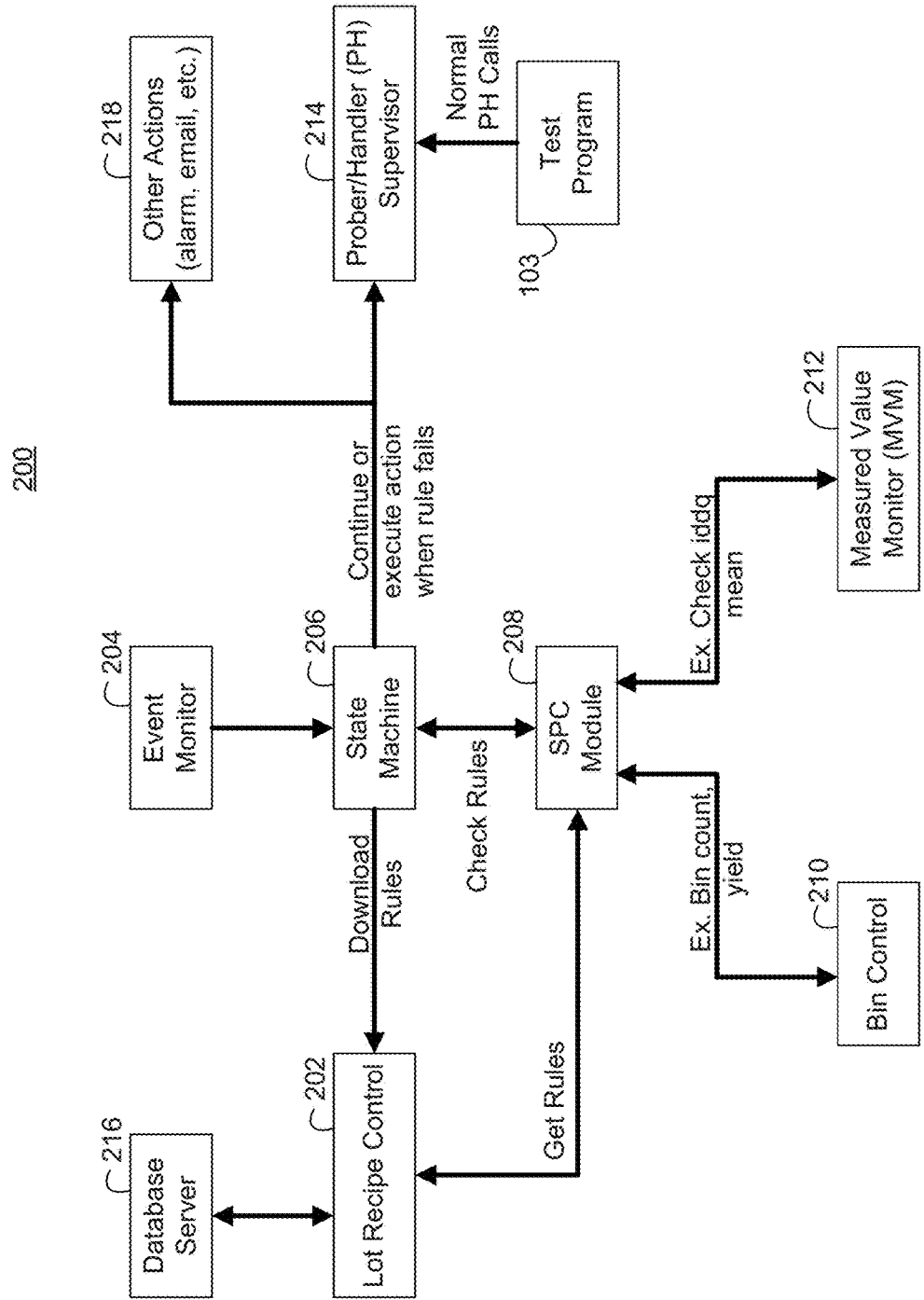
FIG. 2 illustrates an exemplary block diagram of a statistical analysis and control apparatus for real-time management of statistical process controls in accordance with an embodiment of the present invention.

Statistical Analysis and Process Control Framework:

An exemplary statistical analysis and process control framework is illustrated in FIG. 2. The modules illustrated in FIG. 2 make up the main components of the statistical analysis and process control framework. These exemplary modules may perform their individual tasks under the direction of a state machine which is synchronized by a test cell controller 102.

As illustrated in FIG. 2, an exemplary statistical analysis and process control framework 200 comprises a lot recipe control module 202, an event monitor 204, a state machine 206, a statistical process control (SPC) module 208, a bin control module 210, a measured value monitor (MVM) 212, and a prober/handler (PH) supervisor 214. An exemplary lot recipe control module 202 may query a database server 216 for desired SPC rules when requested by the state machine 206. In one exemplary embodiment, this occurs at the beginning of a testing of a lot.

In one embodiment, the modules making up the statistical analysis and process control framework 200 may be interconnected by a test cell communications framework. In one exemplary embodiment, inter-module commands may be implemented using architecture independent shared memory structures and common semaphore synchronization patterns. In one exemplary embodiment, inter-module commands may comprise a command and associated parameters (e.g., command parameters may be a dictionary of key value pairs, raw text, or raw binary). In one embodiment, commands (e.g. commands from the state machine 206 to the SPC module 208) may be sent directly from a point of origination to a destination module, while event notifications may be sent from a point of origination to all modules on the test cell communications framework.

Actions of the modules, such as the state machine 206 and the SPC module 208 may be dependent upon receiving event notifications concerning activities in the test cell. The event notices inform the interconnected modules what events are happening and where in the test flow the test cell currently is. In one embodiment, the SPC module 208 performs SPC rule verifications as directed by commands from the state machine 206, wherein the state machine tracks the state of the testing process, e.g., where in the testing process the test cell is and what SPC rules are ready to be verified. In one exemplary embodiment, SPC rules that are executed at the start of or end of a die or lot or after a needle cleaning or other change may be dependent upon event notifications received. For example, the SPC module 208 may perform SPC rule verifications when specific test conditions have been met, such as a predetermined quantity of parts tested (e.g., an interval) before a next execution of an SPC rule, or at a beginning or end of a test. As discussed herein, in one exemplary embodiment, the SPC rule verifications may be performed by the SPC module 208 as directed by commands from the state machine 206 as determined by received event notifications.

The event monitor 204, illustrated in FIG. 2, may provide events that cause state transitions in the state machine 206. The events may also be available to other modules. Exemplary examples of events are TESTPROGRAM_EXEC_STARTED, TESTPROGRAM_EXEC_COMPLETED, LOT_STARTED, and TESTFLOW_EXEC_COMPLETED. An exemplary state machine 206 may track a current state by transitioning on events. These exemplary state transitions may execute exemplary function callbacks which may cause SPC rules to be evaluated. In one exemplary embodiment, the state machine 206 may synchronize SPC rules download, evaluation, action execution, and reporting. As discussed herein, event notifications generated by the event monitor 204 may be transmitted via the test cell communications framework to all modules of the statistical analysis and process control framework 200 so that modules, such as the state machine 206 and SPC module 208 may be notified when key events occur. In one exemplary embodiment, as described herein, the state machine 206 may send commands to the SPC module 208 for SPC rules verification based upon received event notifications.

An exemplary SPC module 208 may use the SPC rules queried at the beginning of a lot, and under the control of the state machine 206, execute those rules at required intervals. The exemplary statistical process control module 208 may also use the bin control module 210 and the MVM module 212 for SPC data. In one exemplary embodiment, the SPC module 208 executes the SPC rules (e.g. performs all verifications and evaluations of SPC rules). An exemplary bin control 210 may track overall bin counts, consecutive bin counts, and yield (overall and per site) values. In one exemplary embodiment, the bin control 210 keeps track of yield and binning values.

An exemplary MVM module 212 may track values and test time statistics overall and per site, and also capture raw data at 30 second intervals. In one exemplary embodiment, an MVM module 212 may monitor test results and provide on-the-fly statistical computations. An exemplary prober/handler supervisor 214 may load and control the execution of a prober or handler driver as requested by an application model or a state machine 206. In one exemplary embodiment, a prober/handler supervisor 214 may provide programmable hold-off states for executing SPC rule-initiated actions (example: needle cleaning) As discussed below, the hold-off states may hold prober or handler commands issued from a test program 103 while a prober or handler command issued from the state machine 206 is executed. Such a hold-off is transparent to the test program 103.

In one exemplary embodiment, the statistical analysis and process control framework 200 may allow for efficient communication with and control of modules which can collect SPC required data such as parametric test value statistics and test time statistics. The framework may then allow the quick and transparent execution of SPC actions in a short loop when an SPC rule fails. In one exemplary embodiment, the short loop SPC rules are checked with minimum overhead and actions in response to detected process control rule failures can occur quickly. Exemplary statistical analysis and process control framework 200 embodiments are able to achieve this by providing very fast communications that include inter-module commands and event notifications. Such communications may be coordinated with a state machine module 206. Therefore, every module may be aware of crucial test cell events such as an end of testflow execution or a test cell program being ready to run.

In one exemplary embodiment, the statistical analysis and process control framework 200 uses a modular architecture with components (e.g., modules) that implement specific actions. The heart of an exemplary statistical analysis and process control framework 200 is the state machine module 206 which coordinates a query for SPC rules, SPC rule execution (e.g. verification), and execution of required actions. The state machine module 206 communicates with each of the modules required to evaluate an SPC rule. In one exemplary embodiment an MVM module 212 may provide both raw and statistical data on measured values and test suite test times. The bin control module 210 can provide both bin counts and yield (both overall and per site).

Adaptive Value Capture for Process Monitoring:

As discussed herein, all data (good and bad) are captured and saved into a data log. Analyzing the test data while it is still being gathered could result in SPC rules acting based upon the statistical analysis of the measured values (once a minimum quantity of test result values have been gathered as required for each particular statistical analysis) even before the testing of a semiconductor wafer or wafer lot is complete. However, such real-time monitoring may adversely affect testing efficiency.

Semiconductor wafers have increased in diameter from 6 inches to diameters larger than 12 inches. While smaller semiconductor wafers required less test time to test and analyze the test results, the use of larger diameter wafers has dramatically increased testing time requirements. The required testing time has also increased as individual semiconductor dies on semiconductor wafers have become more highly integrated. Such exemplary semiconductor dies comprise many more functions within each die, requiring an increase in the number of measurements to be performed on each die. In other words, not only have semiconductor wafers increased in diameter size, with a corresponding increase in the total number of dies to be tested, but the individual dies have also increased in complexity and functionality, requiring a corresponding increase in the number of measurements and tests to be performed on each die. For example, when previously a semiconductor die might have required only a handful of analog measurements, today an exemplary semiconductor die containing a processor for a hand-held computer or cell phone may require over 2000 measurements during testing. Real-time monitoring and analysis of test results from such a semiconductor wafer would unfavorably and unacceptably affect testing time. Therefore, as noted herein, only after a wafer has completed testing (3-4 hours or more for a given semiconductor wafer) would conventional statistical analysis be performed on the captured test data values.

In one embodiment, rather than monitoring and analyzing in real-time all of the test results, a limited number of "critical" or "interesting" tests can be selected for real-time monitoring and analysis. Only these identified tests would be monitored and analyzed in real-time. Such a limited number of tests (e.g., 25-50) would have a negligible effect on the test cell software and little to no affect on testing time. In one embodiment, after a semiconductor wafer has finished testing, a report may also be generated based upon the test results of the selected tests monitored in real-time. Furthermore, as discussed herein, in addition to the selection of a limited number of tests to monitor, the selection of tests may adaptively change as the testing processes (e.g., as each lot is processed, the selection of tests may adaptively adjust).

As discussed in detail herein, rather than wait until the current wafer has completed testing before statistical analysis begins, an exemplary adaptive value capture process performs statistical analysis only on critical test data values. The adaptive value capture process monitors the data stream flowing to the data log. In one embodiment, the adaptive value capture process continuously collects the most "interesting" measured values (both failing and passing) for further engineering validation and analysis.

As discussed herein, the adaptive value capture process may make "spot measurements," for example, checking all failing test data values, checking all tests with a high recovery rate (those tests have previously failed and then subsequently passed), checking tests that are marginal and/or trending away from a center distribution, and checking those test data values with a standard deviation distribution that are too close to an upper or lower limit. Table 2 illustrates a comparison of conventional test data capture and analysis and an exemplary adaptive value capture process.

TABLE 1

Comparison of Data Capture

| | Conventional Testing | Adaptive Value Capture |
|---|---|---|
| Method | Captures all values regardless of pass/fail | Captures only "interesting" values |
| Test Time | Some impact | Near zero impact |
| Real Time | No. End of wafer. | Yes. Within die at time of measurement. |
| Data Volume | Large (Gigabytes per | Small |

TABLE 1-continued

Comparison of Data Capture

| | Conventional Testing | Adaptive Value Capture |
|---|---|---|
| | wafer) | |
| Availability | Only for programs enabling the formatter. | For all programs - independent of formatter choice |
| Network | High bandwidth. | Low bandwidth |
| Storage | Multi-Gigabytes. | megabytes to low gigabytes. |
| Data Uses | Offline only. | Short loop SPC, long loop SPC, and offline analysis. |

Figure 3A:
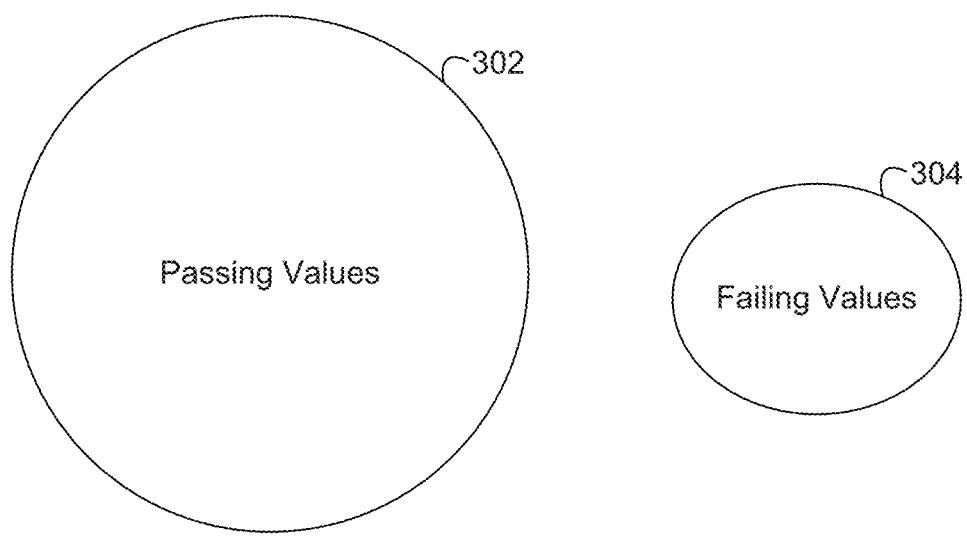
FIGS. 3A and 3B illustrate Venn diagrams illustrating exemplary intersections between passing test values and failing test values.
Figure 3B:
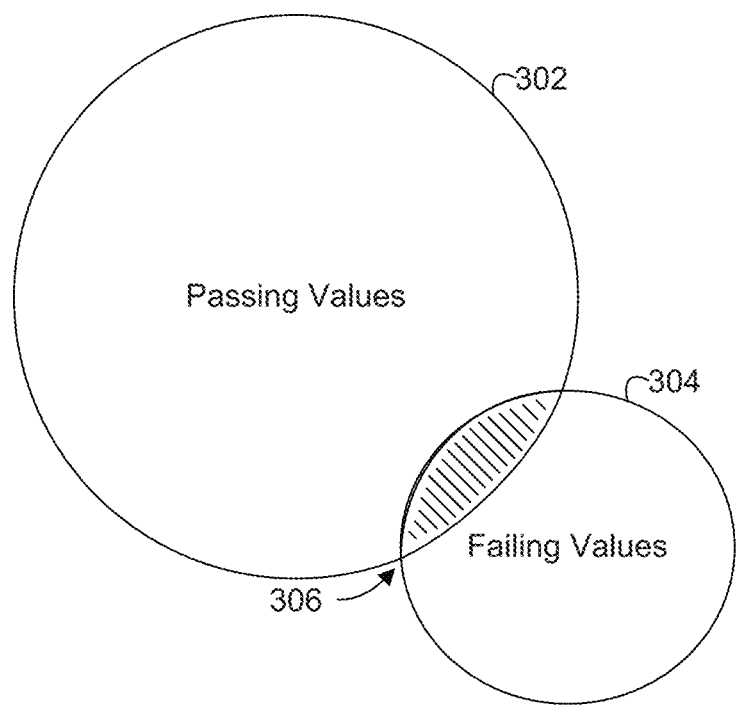

FIGS. 3A, 3B, 4, 5A, and 5B illustrate exemplary interesting or critical tests that may be selected for real-time monitoring and analysis. FIGS. 3A and 3B illustrate exemplary Venn diagrams illustrating intersections of passing values 302 and failing values 304 that may or may not be selected for real-time monitoring. As illustrated in FIG. 3A, the MVM 212 may capture testing values for currently failing tests 304, but no testing values from passing tests 302 will be selected for real-time capture and analysis unless selected by either the SPC 208 or the adaptive value process module.

FIG. 3B illustrates a Venn diagram where tests selected for monitoring may include testing values for currently failing tests 304 and a portion 306 of the testing values from passing tests 302. As discussed herein, those exemplary passing test measurement values may be test results from a test with a high recovery rate, test results that are trending, and test results that are marginal, etc.

Figure 4:
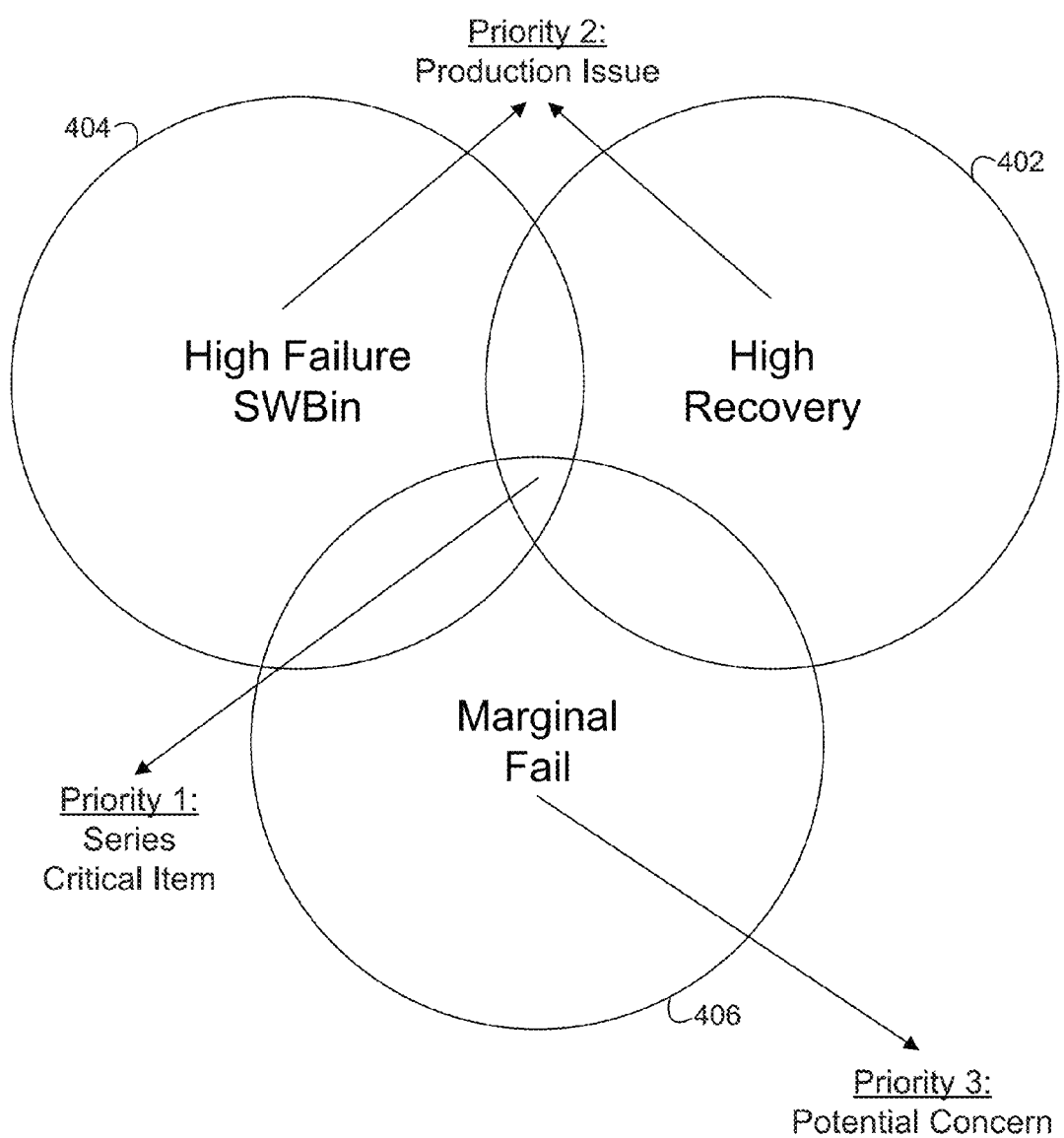
FIG. 4 illustrates a Venn diagram illustrating exemplary intersections between tests with high failure, high recovery, and marginal failure rates with corresponding test analysis priorities in accordance with an embodiment of the present invention.

FIG. 4 illustrates another exemplary Venn diagram demonstrating a use of failures in selecting critical or interesting tests for real-time monitoring and analysis. As illustrated in FIG. 4, a first priority, an exemplary series critical item, includes an intersection where high recovery failures 402, high failures in SW Bins 404, and marginal failures 406 intersect. A second priority includes an intersection where high recovery failures 402 and high failures in SW Bins 404 intersect. Lastly, a third priority includes those failures that are identified as marginally failing 406. In other words, in selecting tests for real-time monitoring and analysis, the selected 25-50 tests may be chosen from tests that fall into one or more of the three priorities, with tests in the first priority having selection priority over those that are only found in the second and/or third priority.

Figure 5A:
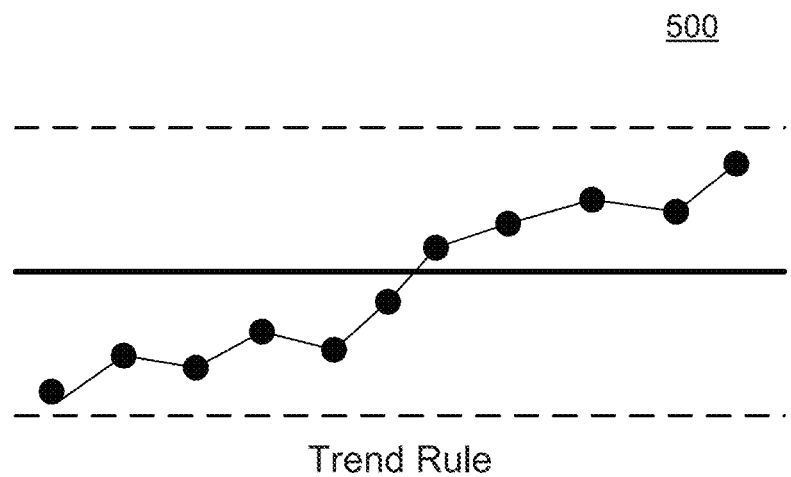
FIGS. 5A and 5B illustrate simplified diagrams illustrating trending test results in accordance with an embodiment of the present invention.
Figure 5B:
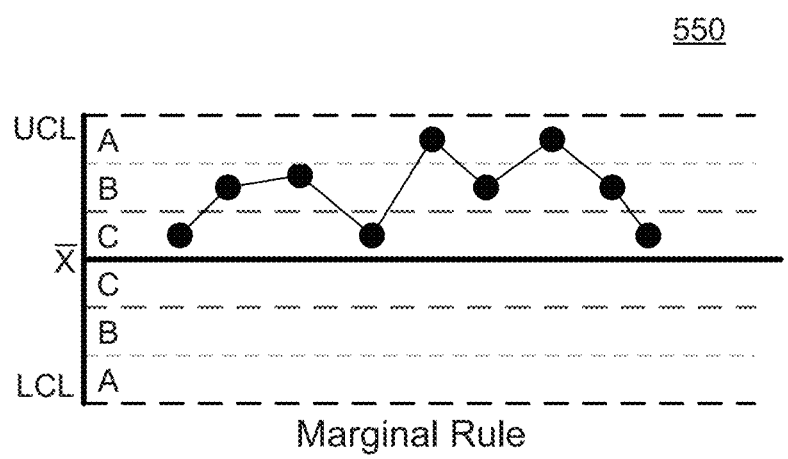

FIGS. 5A and 5B illustrate exemplary test results that, while still passing, are considered trending (FIG. 5A) or marginal (FIG. 5B). As illustrated in FIG. 5A, a test result may be considered trending when the test results shift in value (either up or down) by more than a threshold amount in a given period. As illustrated in FIG. 5B, a test result may be considered marginally failing when the test results are below the upper limit (UCL) or above the lower limit (LCL), but within a selected range (e.g., sections A, those sections of the diagram closest to the upper and lower limits).

Figure 6:
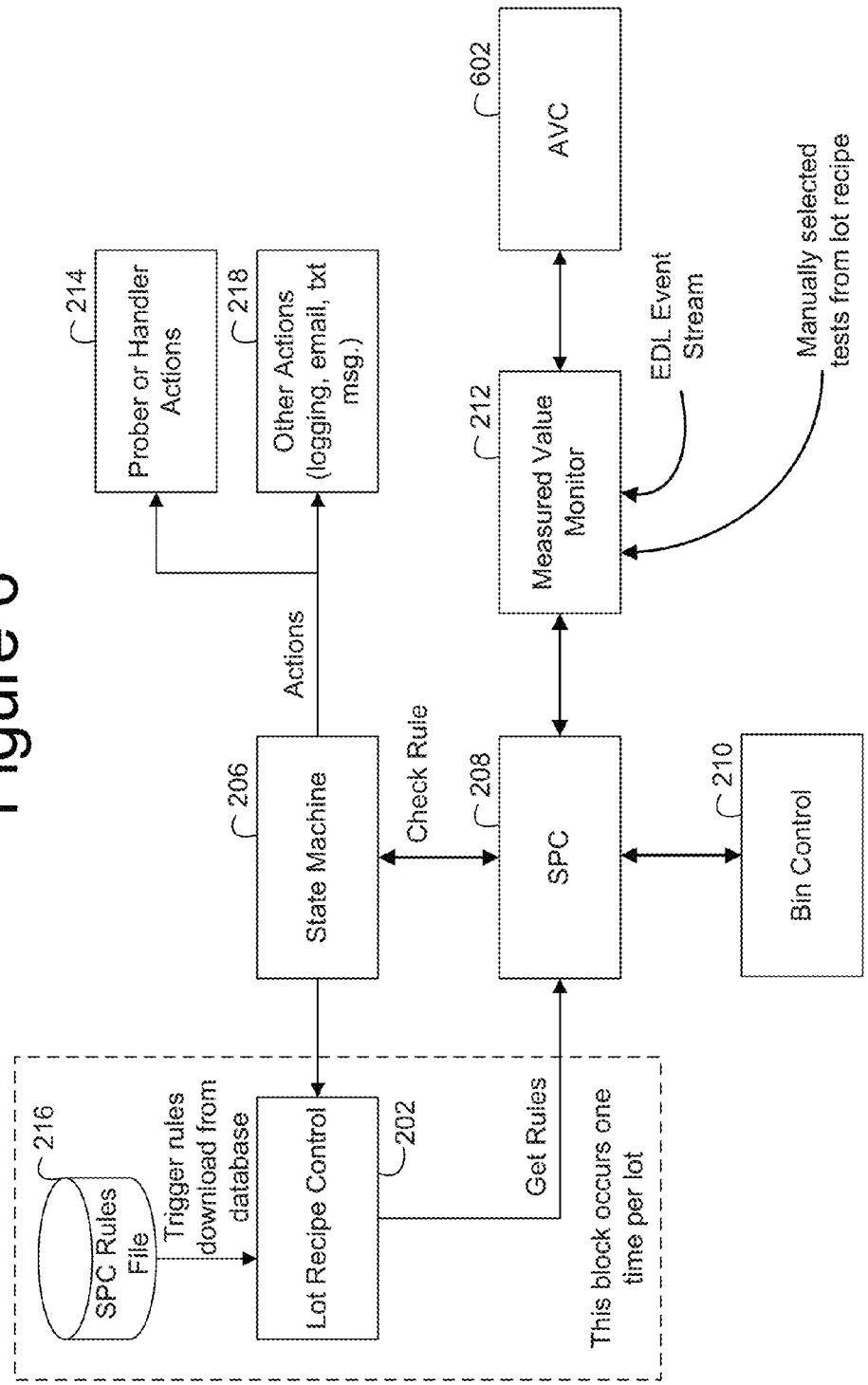
FIG. 6 illustrates an exemplary block diagram of a statistical analysis and control apparatus for real-time analysis of selected test results in accordance with an embodiment of the present invention.

Statistical Analysis and Process Control Framework with Adaptive Value Capture Monitor:

FIG. 6 illustrates an exemplary embodiment with an adaptive value capture (AVC) module 602. As illustrated in FIG. 6, and discussed herein, the MVM 212 performs all real-time statistical analysis. The AVC module 602 and SPC module 208 are users of this information. The SPC module 208 may use manually selected tests of interest, or the AVC module 602 may automatically select tests for consideration. Current statistical data is stored in memory by the MVM module 212 and then moved to a database at the end of a wafer or lot. The MVM memory based data is used for real-time AVC module 602 processing. As discussed herein, when a new lot is started, previous test selection information stored in the database may be considered by an AVC process to enable adaptive critical test selection.

In one exemplary embodiment, SPC rules are read from a configuration file and executed in the test cell in real-time. As noted in FIG. 6, the SPC rules are retrieved by the Lot Recipe Control 202, once, at the beginning of each lot. As discussed herein, useful data analysis will require a consistent history of comparable results. Test measurement values from a selected test must be collected within the lot run. Test measurement values from another test can be added during each new lot. Lastly, test measurement values from a test currently being monitored should not be removed from the list of collected test values within the run. A change in hardware (e.g., a bad probe card) will initiate a new lot event, and therefore, a new window to update monitored tests (while also triggering a new rules download).

In one embodiment, an exemplary AVC module 602 may be configured to collect a level of data suitable to a production floor's interests. For example, a failing values threshold may be set to 15 values (when a test has failed at least 15 times), and a recovery rate may be set to 10% or higher, while recovery tests may default to 10 values. In addition, particular tests by name may be expressly included or expressly excluded.

Statistical Process Control and Adaptive Value Capture:

As noted herein, SPC rule examples include the following:

Data Monitored: Yield, Bin Count, Measured Value, Prober/Handler Parameters, Custom Data Source, etc.

Rule Type: Limit monitoring, Site to site difference, marginal, trend, etc.

Actions: email, needle cleaning, retest, Z-height adjustment, stop, etc.

An exemplary AVC module 602 continuously collects the most "interesting" test measurement values (passing and failing) for further engineering validation and analysis, while an exemplary SPC module 208 provides real-time control to enable proactive and preventive action. As discussed herein, the AVC module 602 and the MVM module 212 together provide a selected, continuous stream of the most interesting and relevant test measurement values.

Figure 7:
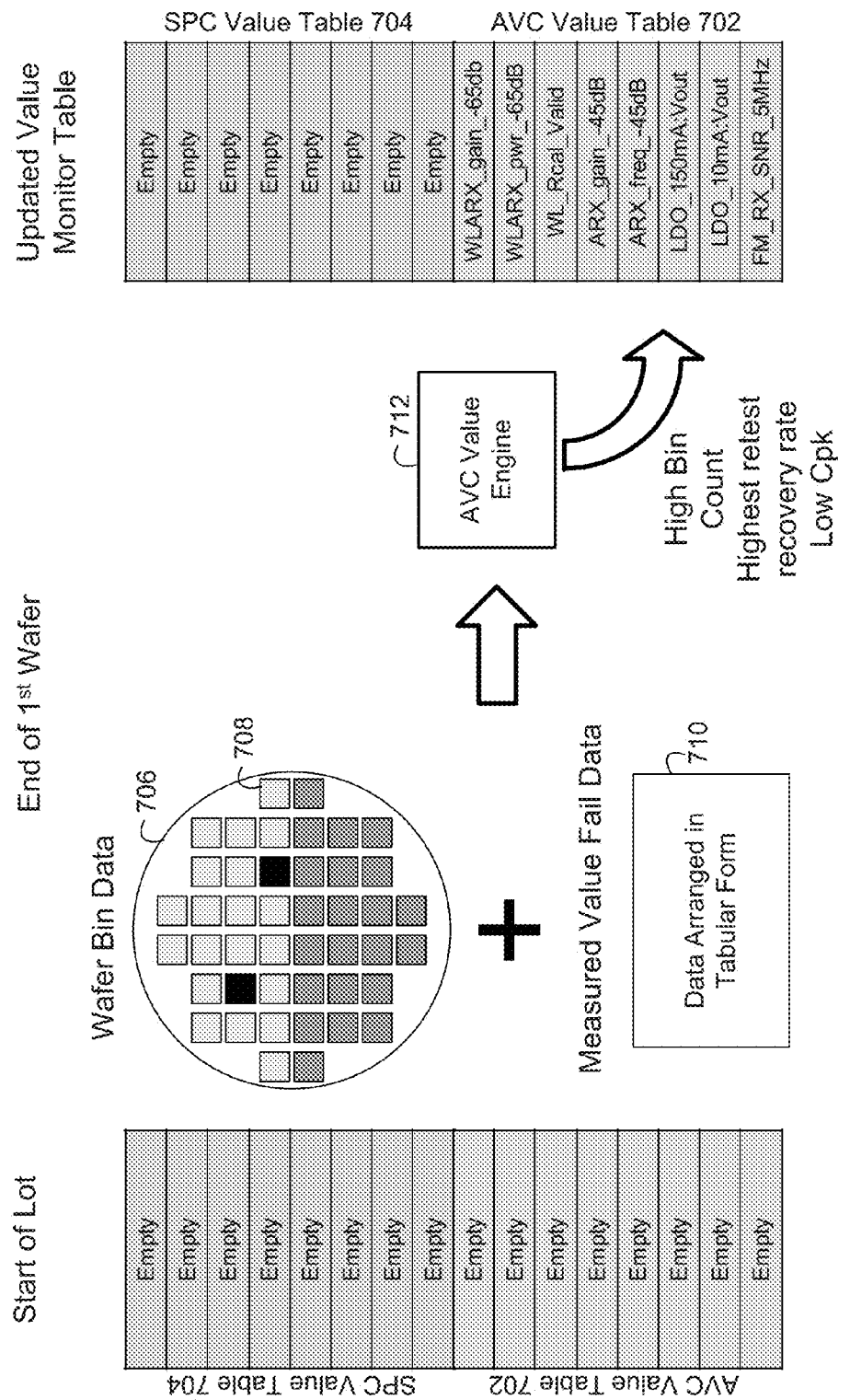
FIG. 7 illustrates a exemplary block diagram of an exemplary process for testing a first wafer of an initial wafer lot to determine a selection of test results to monitor in real-time for following wafers of the initial wafer lot in accordance with an embodiment of the present invention.

FIG. 7 illustrates an exemplary process for starting a new test program. At the start of a lot, an exemplary AVC value table 702 and an exemplary SPC value table 704 are empty as there is no history in the beginning of tests to monitor. In one exemplary embodiment, a first semiconductor wafer of a semiconductor wafer lot is carefully testing and the test results closely analyzed. This first semiconductor wafer may be used to identify the characteristics of the rest the current semiconductor wafer lot. As discussed herein, once the first wafer has been analyzed, a selection of tests (25-50) may be chosen for real-time monitoring and analysis for the remainder of the semiconductor wafers of the lot.

When a first semiconductor wafer 706 comprising a plurality of semiconductor dies 708 has completed testing, measured value fail data 710, arranged in tabular form, along with the results of the wafer bin data, are passed to an AVC value engine 712 of the AVC module 602. The AVC value engine 712, based upon the test results of the first wafer 706, selects a series of tests to place into the AVC value table 702 to update the AVC value table 702. For example, tests may be placed into the AVC value table 702 for continuous monitoring in real-time when the tests have a high failure rate, a high recovery rate that is above a threshold, or are marginal or trending. The rest of the lot will have test measurement values for those selected tests continuously collected and analyzed regardless of whether they are currently passing or failing. In one exemplary embodiment, all tests that have failed will also be collected. In one embodiment, once the first wafer 706 has finished testing and analysis, 25-50 tests are selected for real-time monitoring for the remaining wafers 706 of the lot.

As discussed herein, the selection of tests for real-time monitoring and analysis may be performed in accordance with a selection process that includes several adjustable parameters. For example, individual tests may be expressly selected or deselected. Furthermore, the adjustable parameters may be used to determine thresholds for selecting trending, marginal, or failure recovery tests.

Figure 8:
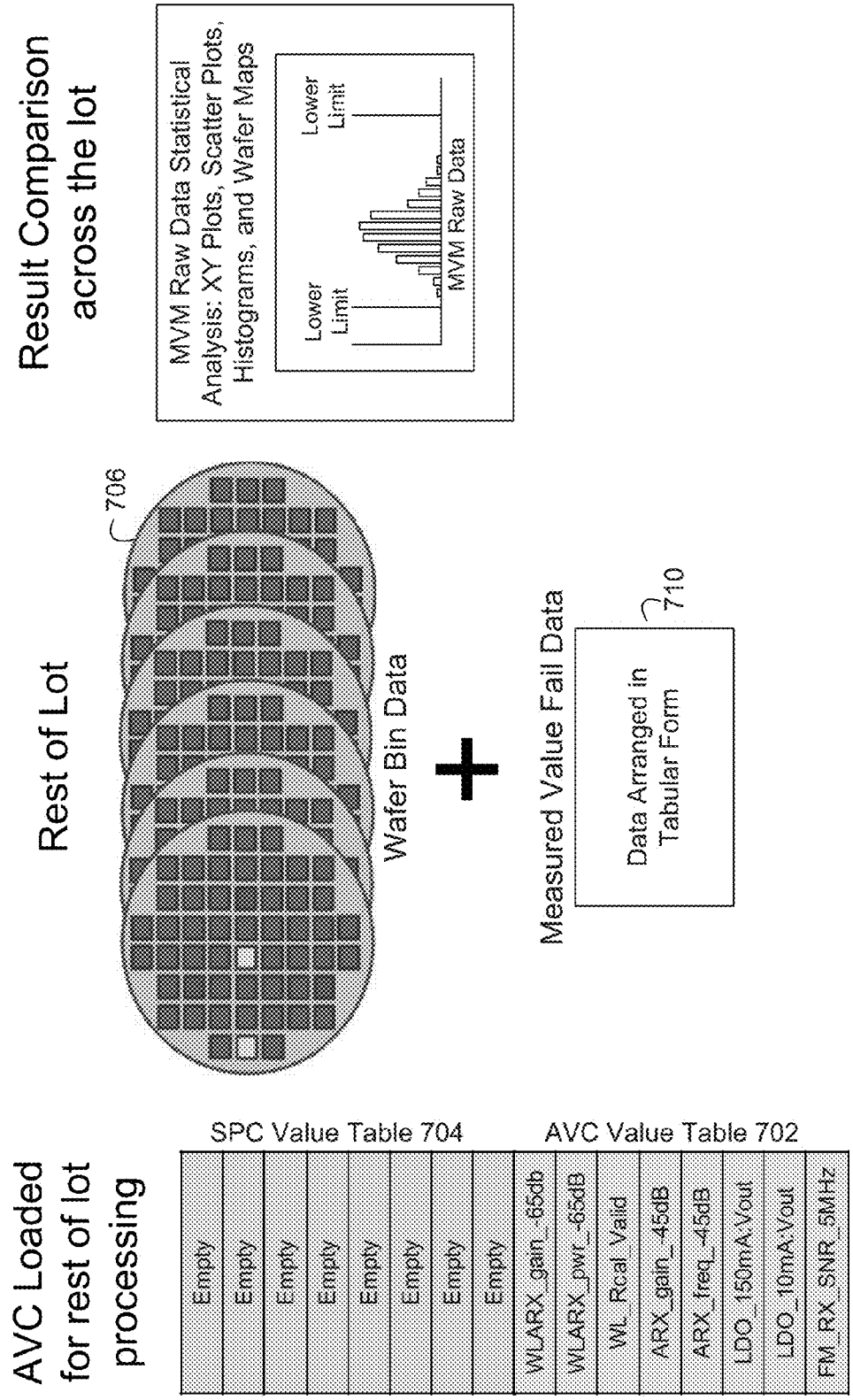
FIG. 8 illustrates a exemplary block diagram of an exemplary process for testing remaining wafers in an initial wafer lot while monitoring a selection of test results in real-time in accordance with an embodiment of the present invention.

FIG. 8 illustrates an exemplary process for testing the rest of the wafers 706 of the lot. As illustrated in FIG. 8, the AVC value table 702 of the AVC module 602 is loaded with tests selected for real-time monitoring (determined after the first wafer 706 was analyzed), while the SPC value table 704 remains empty. After the lot has finished testing, values may be compared across the lot for further analysis. Value comparison will be possible because the collected test data values will be consistent across the lot. In one embodiment, all of the wafers of a lot will have come from a same silicon ingot, have come from a same process that created them, and therefore, have similar characteristics such as yield and failures.

Figure 9:
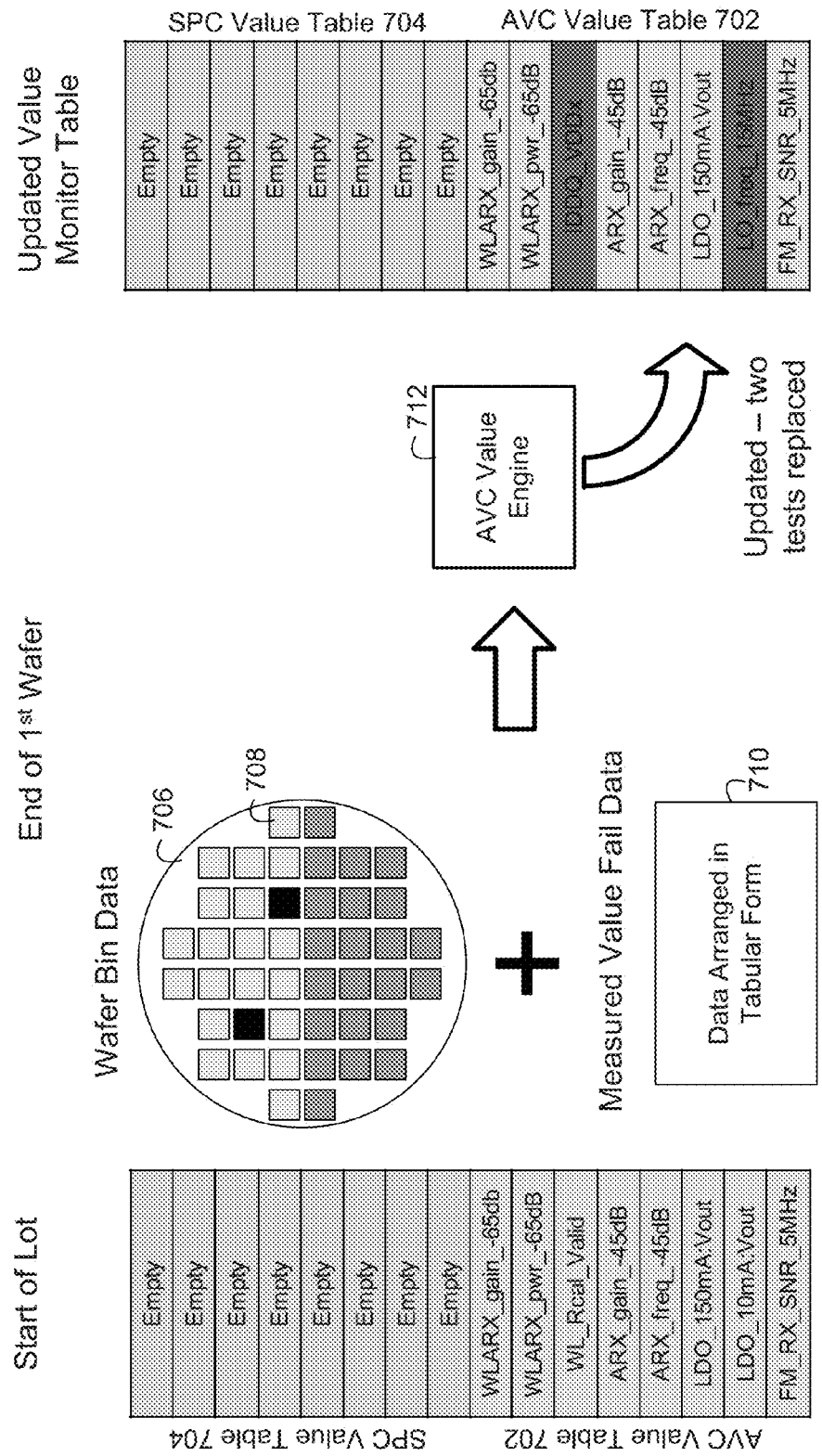
FIG. 9 illustrates a exemplary block diagram of an exemplary process for updating a selection of test results that are monitored in real-time after an initial wafer lot is tested and analyzed in accordance with an embodiment of the present invention.

FIG. 9 illustrates an exemplary process for starting the testing of a first wafer 706 of a follow-on lot of wafers. As illustrated in FIG. 9, at the start of a next lot, the AVC value table 702 contains those tests previously selected for monitoring (AVC history is loaded from a previous lot run as illustrated in FIG. 6), while the SPC value table 704 remains empty. When the first wafer 706 comprising a plurality of dies 708 has completed testing, measured value fail data 710, arranged in tabular form, along with the results of the wafer bin data, is passed to the AVC value engine 712 of the AVC module 602. The AVC value engine 712, based upon the test results of this next first wafer 706, may select one or more tests for placement into the AVC value table 702 to update the AVC value table 702 (one or more previous selections are replaced by the updated selections). For example, the one or more tests selected may have a failure recovery rate higher than one or more tests previously in the AVC value table 702. The remaining wafers 706 of this current lot will be tested, with the currently selected tests in the AVC value table 702 monitored and analyzed in real-time.

Figure 10:
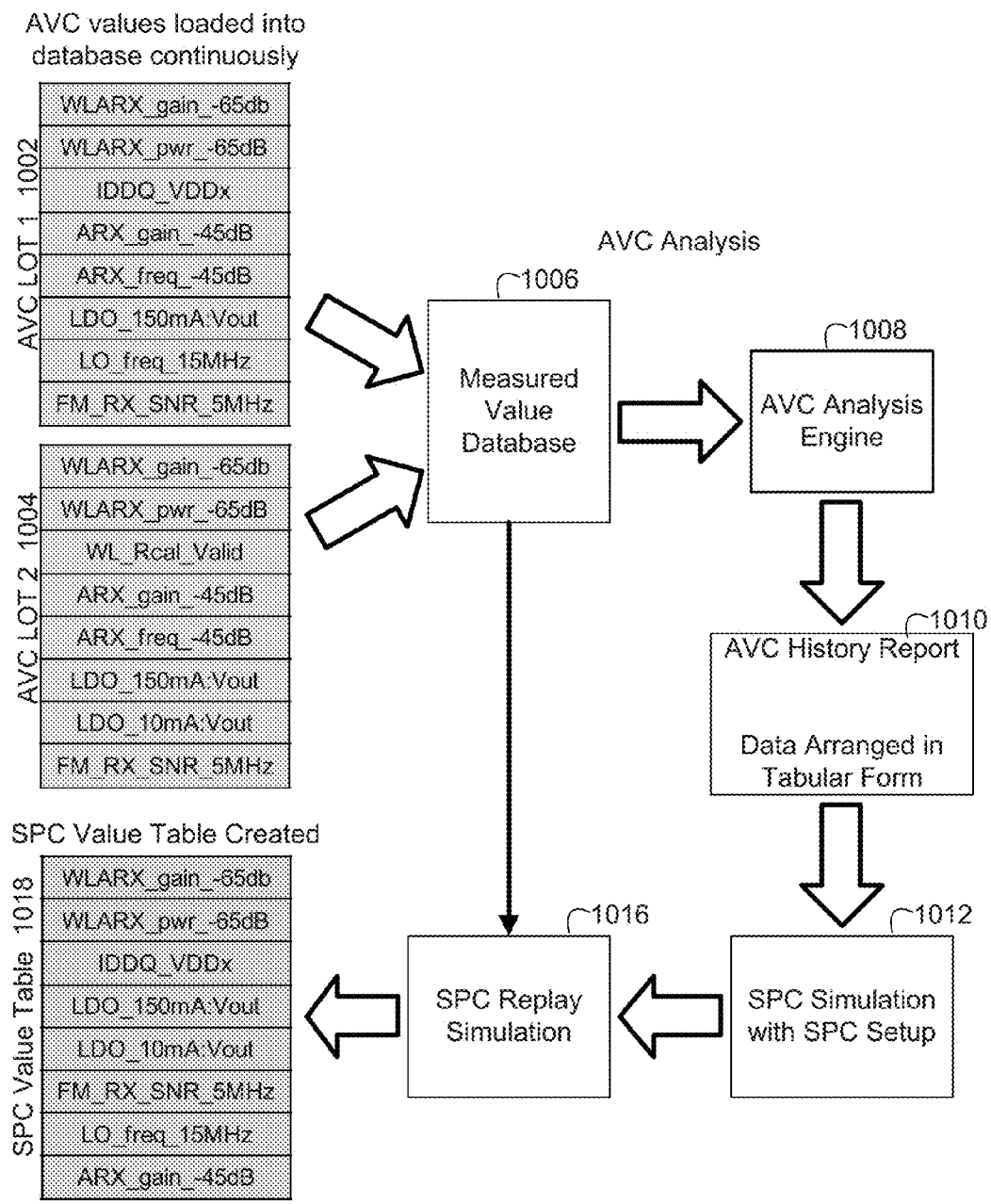
FIG. 10 illustrates a exemplary block diagram for statistical process control value assessment selection in accordance with an embodiment of the present invention.

FIG. 10 illustrates a process for selecting SPC rules for real-time monitoring as determined by statistical process control simulation and analysis. As illustrated in FIG. 10, selected test data results for each lot are loaded into a database continuously. For example, the test measurement values of selected tests for a first lot 1002 and a second lot 1004 are loaded into a measured value database 1006 to be analyzed by an AVC analysis engine 1008. In one embodiment, the AVC analysis engine 1008 may create an AVC history report 1010, such as a "top failures" report of the bins→tests→values across all slots. The AVC history report 1010 is used to select SPC tests for SPC Simulation 1012 and SPC Replay Simulation 1016, using the values from the measured value database 1006. The SPC rule setup may be iterated until desired alert/alarm accuracy is achieved. In one embodiment, the simulation rules are converted into production rules and used to select the corresponding tests for monitoring 1018. In other words, as noted above, the MVM 212 may continuously monitor and analyze a particular test (whether the test is passing or failing) when the test is selected by either the SPC module 208 or the AVC module 602.

In one embodiment, the test results of the previous lots, as well as the currently selected tests for real-time monitoring, may be used to identify tests that have been going in and out of failing (e.g., a test may fail during a test run because of process problems and then pass during subsequent test runs when the process has been corrected). In one embodiment, tests that have been occasionally failing may be selected for real-time monitoring. As noted above, the selection process may carry forward from lot run to lot run those tests that fall in and out of failing. In one embodiment, the selection process may look at tests that failed in previous lots and at tests that have failed in a current first semiconductor wafer.

In one embodiment, the selection process of the AVC module 602 may be used as an expert system that uses a same set of criteria that a user would use to pick critical or interesting tests for real-time monitoring and analysis, but without the user having to be actively involved in the selection of the critical and/or interesting tests. In one embodiment, the selection process in the adaptive value capture process may be programmable (e.g., individual thresholds may be selected to aid the process in selecting marginal or trending tests). The selection process may also be set so that certain selectable tests will be ignored (e.g., gain or current measurements: there is no need to monitor whether a gain is near or above an upper threshold, or whether a current draw is near or below a lower threshold). In one embodiment, the selection process of the AVC module 602 receives inputs to parameters that are used in the selection process.

In one embodiment, the selection process selects critical and/or interesting tests according to several priorities. In general, when considering failing values, the selection process will utilize the following priorities: HW Bin failures>SW Bin failures>particular test failures>test measurement values. For example, a first priority may include monitoring tests with failure recovery rates above a threshold. The first priority may also include tests that are marginally passing but within a selected threshold of the failure threshold. A second priority may include marginally passing tests such as one-sided distributions to production limits. The second priority may also include passing tests that are trending away from a center distribution. A third priority may include low process capabilities, as identified by cp/cpk values (where the measured values are falling too close to an upper or lower standard deviation limit).

Figure 11:
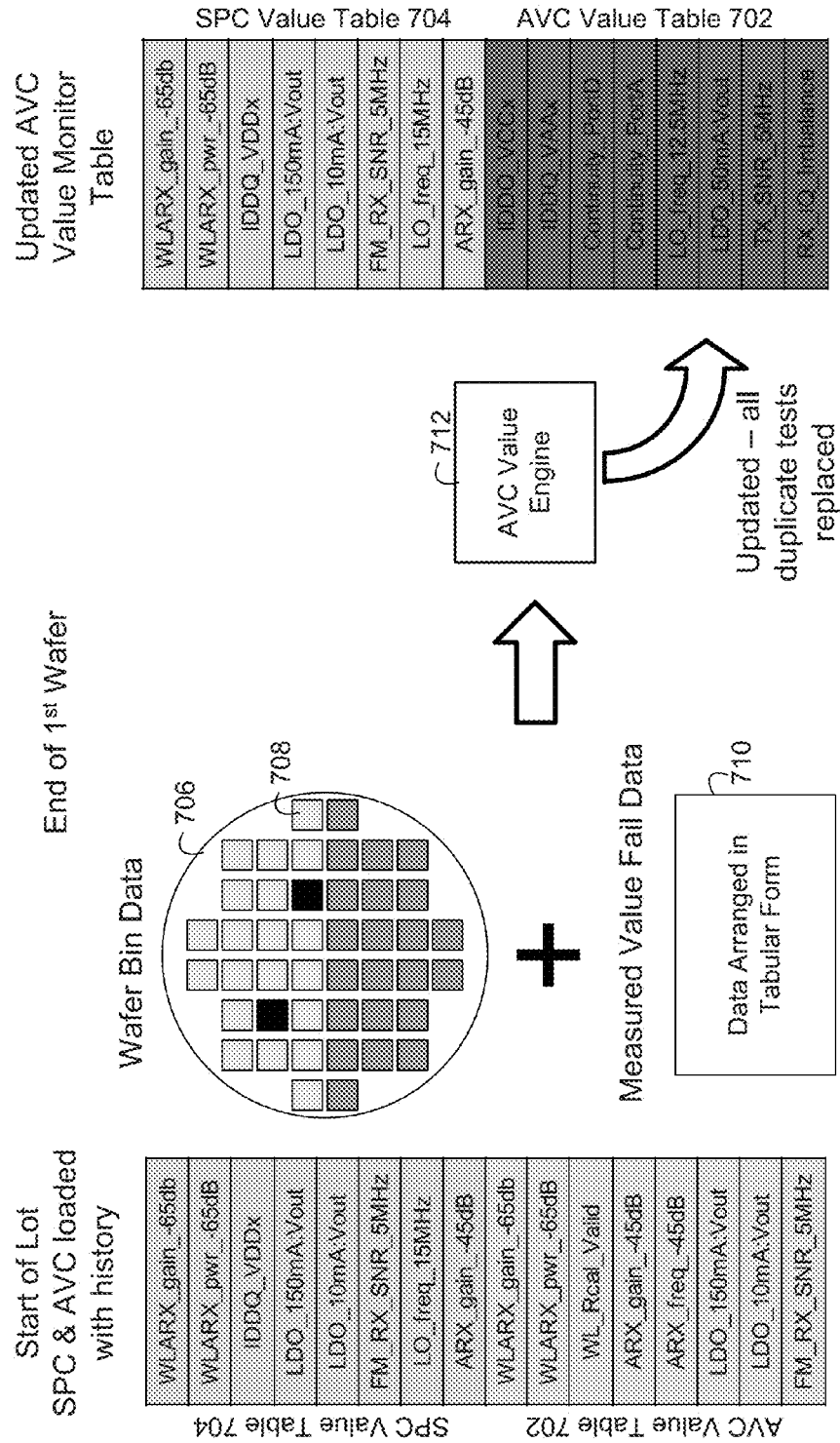
FIG. 11 illustrates a exemplary block diagram of an exemplary processing for testing a first wafer of a subsequent wafer lot to determine a selection of test results to monitor in real-time for following wafers of the subsequent wafer lot in accordance with an embodiment of the present invention.

FIG. 11 illustrates an exemplary process for starting the testing of a first wafer 706 of a follow-on lot of wafers. As illustrated in FIG. 11 and FIG. 6, at the start of a next lot, the SPC rules and AVC history are loaded into the SPC value table 704 and the AVC value table 706, respectively, such that the SPC value table 704 and the AVC value table 706 contain those tests previously selected for monitoring. When the first wafer 706, comprising a plurality of dies 708, has completed testing, measured value fail data 710, arranged in tabular form, along with the results of the wafer bin data, is passed to the AVC value engine 712 of the AVC module 602. As illustrated in FIG. 11, the AVC value engine 712, based upon the test results of this next first wafer 706, may select one or more tests to update the AVC value table by replacing one or more of the current tests in the AVC value table 702 with the newly selected tests. In one embodiment, all duplicate tests are removed, while tests with higher recovery rates or other tests meeting other criteria are selected for inclusion in the AVC value table for follow-on wafers. The remaining wafers 706 of this latest lot will be run with the currently tests in the AVC value table 702 and the SPC value table 704 monitored and analyzed in real-time.

Figure 12:
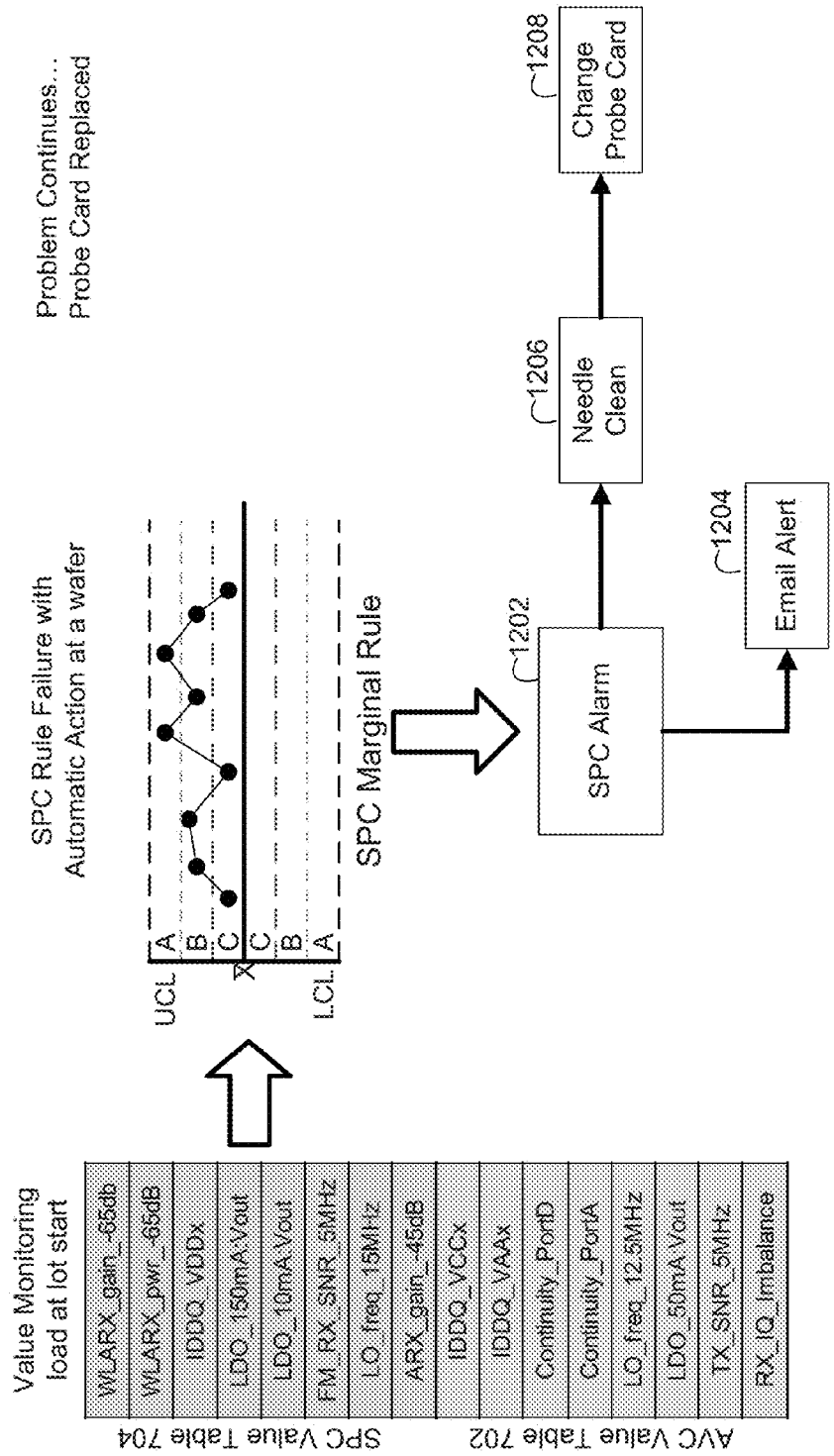
FIG. 12 illustrates a exemplary block diagram of a process for responding to failing test results in accordance with an embodiment of the present invention.

FIG. 12 illustrates an exemplary statistical process control handling method. In one embodiment, a statistical process control system is operable to use the collected test results as criteria for initiating a needed action in response to a monitored test failure, even as the testing process is on-going. For example, the testing could be damaging parts due to a test cell with out of control testing parameters. The selected SPC rules running in real-time could have an available action that pauses testing rather than waiting for an entire semiconductor wafer, or even worse, an entire cassette of wafers to be tested and data analyzed before discovering that the testing process is causing the above described failures. As discussed below, FIG. 12 illustrates an exemplary SPC process for handling a detected bad probe card.

As illustrated in FIG. 12, at the start of a latest lot, the SPC rules and AVC history are loaded into the SPC value table 704 and the AVC value table 702, respectively. As noted above, after a first wafer of the latest lot is tested, the selected tests may be adaptively changed, based upon any new findings in that first tested wafer. In one embodiment, an exemplary SPC marginal rule (monitored in real-time) fails at one of the wafers 706. As illustrated in FIG. 12, when the SPC marginal rule fails, an SPC alarm 1202 is initiated which results in an email alert 1204 and a needle cleaning 1206. As further illustrated in FIG. 12, after the needle cleaning 1206, if the marginal error continues to occur, the probe card may be changed 1208.

In other words, as illustrated in FIG. 12, a user places a semiconductor wafer into a test cell, and at some point during the testing, the test cell is able to stop a current test and announce to the user (either through an visible alarm, email, paging, etc.) that a failure or potential failure has occurred, without having to continue testing and waste valuable testing time and risk causing further damage to wafers (when the testing process is possibly damaging the unit under test). As also illustrated in FIG. 12, the SPC rules that are being monitored in real-time may monitor and analyze the test measurement values and decide whether an alert or some other activity (testing hold, needle cleaning, testing module replacement notification, etc.) needs to be initiated. An exemplary AVC module 602 and SPC module 208 may monitor the selected tests as well as monitor part yields, site-to-site yields, and failure rates, and if a bad failure rate occurs, even if the identity of the failing test is unknown, may initiate a pause in the testing on that basis alone.

Figure 13:
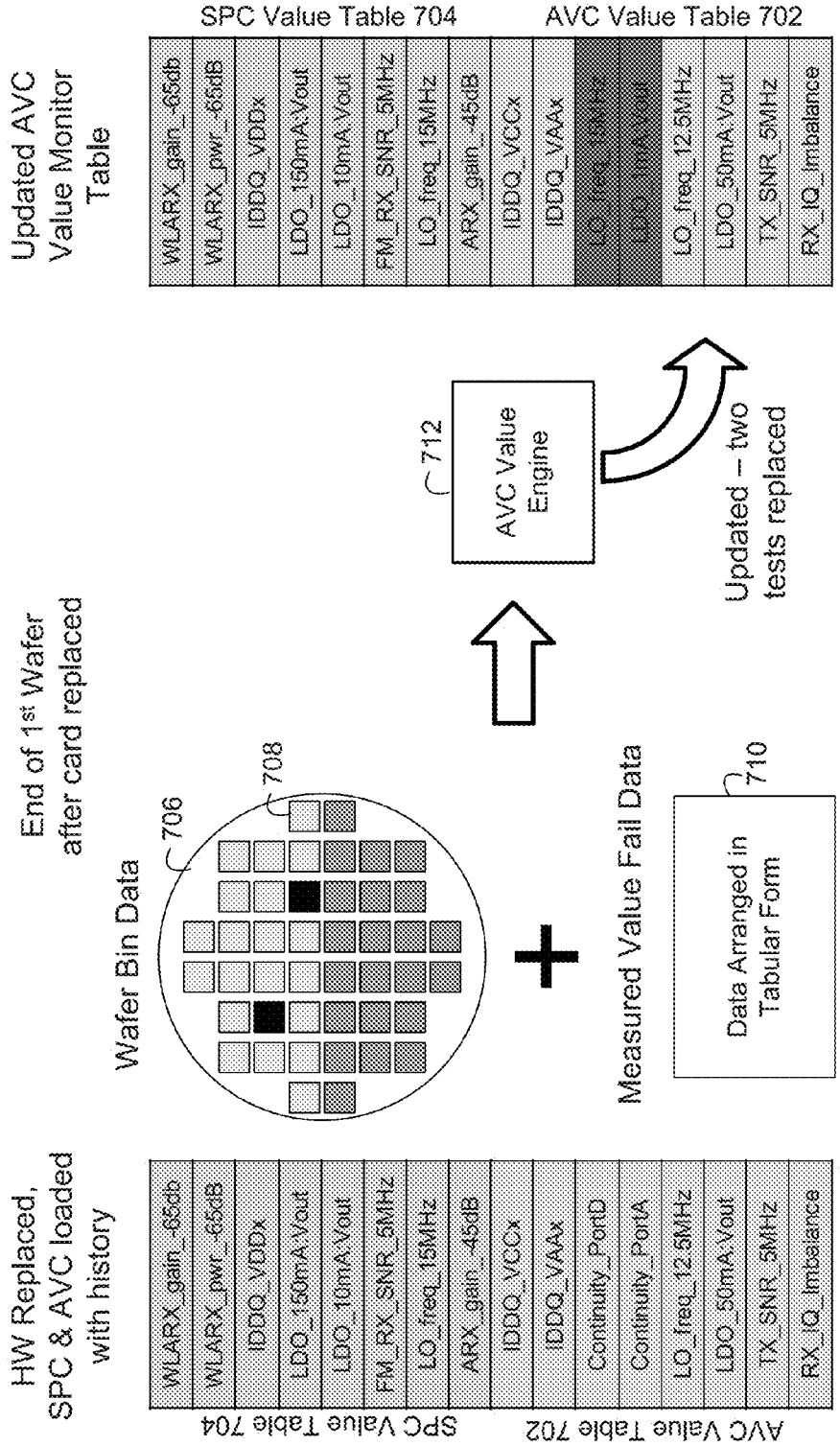
FIG. 13 illustrates a exemplary block diagram of an exemplary process for updating a selection of test results that are monitored in real-time after an initial wafer of a subsequent wafer lot is tested and analyzed in accordance with an embodiment of the present invention.

FIG. 13 illustrates an exemplary process for restarting the testing of a lot of wafers after a hardware change (e.g., probe card replacement). As discussed herein, because of the hardware change, a new lot event is generated. Because a new lot is considered to have started, the next wafer in the lot will be treated as a first wafer in the lot (with SPC value table 704 and AVC value table 702 reloaded), and with the AVC value engine 712 able to select replacement tests for real-time monitoring and analysis. As illustrated in FIGS. 12 and 13, the previously selected continuity tests may be dropped and two other tests selected to replace them. The fact that the continuity tests were dropped may be a key learning for later, by adjusting the selected SPC tests and simulation (allowing the SPC rules to be re-evaluated to consider selecting different SPC rules for monitoring).

Figure 14:
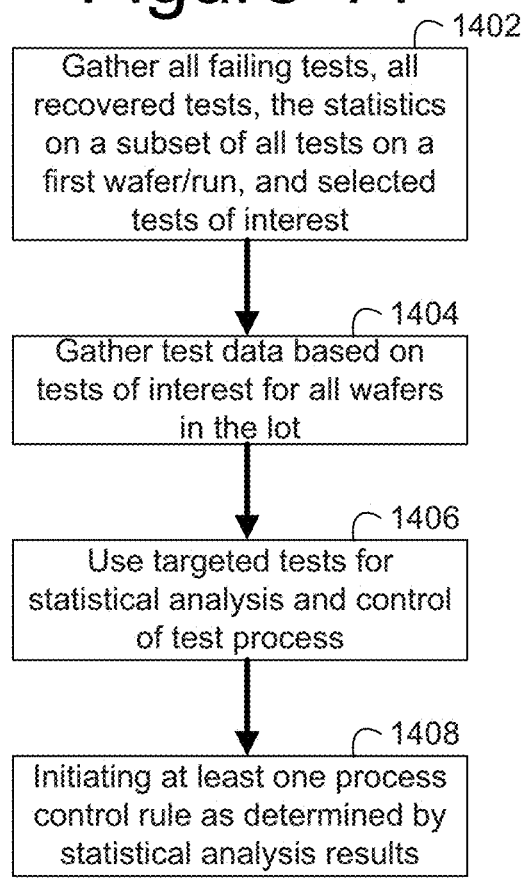
FIG. 14 illustrates a flow diagram, illustrating computer controlled steps of a method in accordance with an embodiment of the present invention.

FIG. 14 illustrates the steps to a process for analyzing test results. In step 1402 of FIG. 14, a first subset of tests is selected for continuous real-time monitoring and analysis. As discussed herein, the subset of tests is selected from out of all the tests that are performed on the wafers during testing.

In step 1404 of FIG. 14, test results are gathered from the first subset of tests. As discussed herein, a minimum quantity of test results will be necessary before statistical analysis can take place. As also noted above, the gathering of test results is continuous. All of the tests are also being performed and their measurement results gathered to a data log (those tests that are members of the selected subset of tests also have their test measurement results separated gathered, saved, and analyzed).

In step 1406 of FIG. 14, the statistical analysis of the test results from the subset of tests is used to evaluate SPC rule outcome. In step 1408 of FIG. 14, at least one process control rule, as determined by the results of the first statistical analysis, is executed.

In one exemplary embodiment, the above described AVC module 602 and MVM 212 only impact the testing system (while monitoring test result measurements in real-time) by 0.2-0.3%. This exemplary impact may be seen in an increased processing load and will not impact testing time. The processor performing the testing and analysis for the test cell is able to absorb the few additional demands required to monitor and analysis in real-time a limited portion of all the tests that are being performed and their testing results gathered. As discussed herein, the test measurements are already being collected; the extra process time is used to analyze the selected test results and store them in an additional file.

In one embodiment, the selection process of the AVC module 602 may be used in processes other than testing analysis. For example, manufacturing process parameters (e.g., critical dimensions and placement measurements) may be monitored in a similar fashion as the above described test measurements. As also noted above, a selection of critical or interesting tests may be selected from all the tests that may be used to monitoring the manufacturing process, such that the selected tests may be monitored and analyzed in real-time without disrupting the manufacturing process or introducing a delay. An exemplary drifting of measurement values may be used to initiate an alarm, thereby notifying process managers that a critical measurement or a critical placement dimension has fallen out of a desired range, or while still passing is nearing a threshold.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for analyzing test results using automated test equipment, the method comprising:
   selecting a first subset of tests of interest from a plurality of tests, wherein the selecting of the first subset of tests comprises adaptively changing a selection of the first subset of tests in response to past test results of the plurality of tests and past test result statistical analysis of the past test results by carrying forward past monitored tests to a current lot;
   obtaining test results from the plurality of tests, wherein the plurality of tests are executed using at least one testing apparatus controlled by a test cell controller operable to execute a test program, wherein the test program comprises at least one process control rule, wherein the testing apparatus is communicatively coupled with a prober and a handler, and wherein the prober is operable to come in contact with at least one device under test (DUT) for performing a test;
   performing a statistical analysis on test results from the first subset of tests;
   initiating at least one process control rule as determined by results of the first statistical analysis performed on the test results from the first subset of tests;
   performing the plurality of tests on an initial wafer of a first plurality of wafers; and
   performing statistical analysis of test results generated by the plurality of tests performed on the initial wafer, wherein said selecting the first subset of tests is done based upon the test results of the plurality of tests performed on the initial wafer.

2. The method of claim 1, wherein said performing a first statistical analysis is performed in real-time.

3. The method of claim 1, wherein the first subset of tests comprises at least one of:
   tests that are currently failing;
   tests that have previously failed;
   tests that have previously failed and then subsequently passed;
   tests with a failure rate above a threshold;
   tests with a recovery rate above a threshold;
   tests currently passing but with measurement values above or below a threshold; and
   manually selected tests.

4. The method of claim 1, wherein the first statistical analysis comprises at least one of:
   standard deviation or other statistical evaluation of test results; and
   identifying test result values that are past a threshold but not past an upper limit or a lower limit.

5. The method of claim 1, wherein the at least one process control rule comprises at least one of:
   halting the testing;
   sending a status notification by email or other electronic notification; and
   generating a prober/handler action.

6. A non-transitory computer-readable medium having computer-readable program code embodied therein for causing a computer system to perform a method for analyzing test results using automated test equipment, the method comprising:
   selecting a first subset of tests from a plurality of tests, wherein the selecting of the first subset of tests comprises adaptively changing a selection of the first subset of tests in response to past test results of the plurality of tests and past test result statistical analysis of the past test results by carrying forward past monitored tests to a current lot;
   obtaining test results from the plurality of tests, wherein the plurality of tests are executed using at least one testing apparatus controlled by a test cell controller operable to execute a test program, wherein the test program comprises at least one process control rule, wherein the testing apparatus is communicatively coupled with a prober and a handler, and wherein the prober is operable to come in contact with at least one device under test (DUT) for performing a test;
   performing a first statistical analysis on test results from the first subset of tests;

initiating at least one process control rule as determined by results of the first statistical analysis performed on the test results from the first subset of tests;

performing the plurality of tests on an initial wafer of a first plurality of wafers; and performing statistical analysis of test results generated by the plurality of tests performed on the initial wafer, wherein said selecting the first subset of tests is done based upon the test results of the plurality of tests performed on the initial wafer.

7. The computer-readable medium of claim 6, wherein said performing a first statistical analysis is performed in real-time.

8. The computer-readable medium of claim 6, wherein the first subset of tests comprises at least one of:
   tests that are currently failing;
   tests that have previously failed;
   tests that have previously failed and then subsequently passed;
   tests with a failure rate above a threshold;
   tests with a recovery rate above a threshold;
   tests currently passing but with measurement values above or below a threshold; and
   manually selected tests.

9. The computer-readable medium of claim 6, wherein the first statistical analysis comprises at least one of:
   standard deviation or other statistics of test results; and
   identifying test result values that are past a threshold but not past an upper limit or a lower limit.

10. The computer-readable medium of claim 6, wherein the at least one process control rule comprises at least one of:
    halting a current test;
    sending a status notification by email or other electronic notification; and
    generating a prober/handler action.

11. An automated test equipment (ATE) apparatus for analyzing test results, the apparatus comprising:
    a measured value monitor operable to receive test results from a plurality of tests, wherein the plurality of tests are executed using at least one testing apparatus controlled by a test cell controller operable to execute a test program, wherein the test program comprises at least one process control rule, wherein the testing apparatus is communicatively coupled with a prober and a handler, and wherein the prober is operable to come in contact with at least one device under test (DUT) for performing a test;
    an adaptive value capture module operable to select a first subset of tests from the plurality of performed tests, wherein the measured value monitor is further operable to gather test results from the first subset of tests and perform a first statistical analysis on the gathered test results from the first subset of tests; and
    a statistical process control module operable to initiate at least one process control rule as determined by results of the first statistical analysis performed on the gathered test results from the first subset of tests;
    wherein the adaptive value capture module is further operable to perform statistical analysis of test results generated by the plurality of tests performed on an initial wafer and selects the first subset of tests based upon the test results of the plurality of tests performed on the initial wafer, wherein the adaptive value capture module is further operable to adaptively select the first subset of tests in response to statistical analysis of test results from the plurality of tests.

12. The apparatus of claim 11, wherein the measured value monitor is further operable to perform the first statistical analysis in real-time.

13. The apparatus of claim 11, wherein the first subset of tests comprises at least one of:
    tests that are currently failing;
    tests that have previously failed;
    tests that have previously failed and then subsequently passed;
    tests with a failure rate above a threshold;
    tests with a recovery rate above a threshold;
    tests currently passing but with measurement values above or below a threshold; and
    manually selected tests.

14. The apparatus of claim 11, wherein the first statistical analysis comprises at least one of:
    standard deviation or other statistics of the test results; and
    identifying test result values that are past a threshold but not past an upper limit or a lower limit.

15. The apparatus of claim 11, wherein the at least one process control rule comprises at least one of:
    halting the testing;
    sending a status notification by email or other electronic notification; and
    generating a prober/handler action.

* * * * *